United States Patent [19]

Ejiri et al.

[11] Patent Number: 5,480,269
[45] Date of Patent: Jan. 2, 1996

[54] METHOD OF DRILLING A HOLE FOR PRINTED WIRING BOARD

[75] Inventors: Mitsuo Ejiri; Hidenori Kinbara, both of Tokyo, Japan

[73] Assignee: Mitsubishi Gas Chemical Company, Inc., Tokyo, Japan

[21] Appl. No.: 254,913

[22] Filed: Jun. 6, 1994

[30] Foreign Application Priority Data

Jun. 7, 1993 [JP] Japan .................. 5-135817

[51] Int. Cl.$^6$ .................................................. B23B 35/00
[52] U.S. Cl. .................................................. 408/1 R; 408/56
[58] Field of Search .................. 408/1 R, 56, 61

[56] References Cited

U.S. PATENT DOCUMENTS

| | | | |
|---|---|---|---|
| 4,781,495 | 11/1988 | Hatch et al. | 408/1 |
| 4,929,370 | 5/1990 | Hatch et al. | 252/12.2 |
| 5,067,859 | 11/1991 | Korbonski | 408/1 R |
| 5,082,402 | 1/1992 | Gaku et al. | 408/1 |
| 5,435,671 | 7/1995 | Weimeich | 408/1 R |

FOREIGN PATENT DOCUMENTS

| | | |
|---|---|---|
| 0264816 | 4/1988 | European Pat. Off. . |
| 0470757 | 2/1992 | European Pat. Off. . |

*Primary Examiner*—Daniel W. Howell
*Attorney, Agent, or Firm*—Wenderoth, Lind & Ponack

[57] ABSTRACT

A method of drilling a through-hole for inter-surface conduction in a laminate for a printed wiring board, in which the heat generation in a drill bit can be inhibited in drilling holes, quality holes can be highly efficiently made in the presence, on the laminate surface, of a novel water-soluble lubricant sheet which has high strength and can be handled easily, the method comprising drilling the through-holes in the presence of a water-soluble lubricant sheet which has a thickness of 0.02 to 3 mm and is formed from a mixture of 20 to 90% by weight of a polyether ester with 10 to 80% by weight of a water-soluble lubricant.

4 Claims, No Drawings

METHOD OF DRILLING A HOLE FOR PRINTED WIRING BOARD

BACKGROUND OF THE INVENTION

1. Field of the Invention

The present invention relates to a method of drilling a through-hole for a double-sided or multilayered printed wiring board. More specifically, it relates to a method of drilling a through-hole, in which a water-soluble lubricant is placed so that the generation of heat in a drill bit is prevented in drilling a hole and a high-quality hole is made with high efficiency.

2. Description of the Related Art

U.S. Pat. No. 4,781,495 and U.S. Pat. No. 4,929,370 disclose methods of drilling a hole for inter-surface conduction in a laminate produced by attaching a metal foil on an insulating material, with a water-soluble lubricant placed on one surface, or front and reverse sides, of the laminate. It is disclosed that these methods use a sheet prepared by impregnating paper, etc., with a mixture of a glycol such as diethylene glycol or dipropylene glycol, which is a solid water-soluble lubricant, with a rigid wax such as fatty acid or a nonionic surfactant.

However, the problem of the above methods is that the effect on the prevention of heat generation in a drill is insufficient, in that the porous sheet is only poorly impregnated with the above mixture of that the sheet is sticky.

JP-A-4-92488 to JP-A-4-92493 disclose methods of drilling a hole in a laminate with a specific water-soluble lubricant placed on the laminate. It is disclosed that in these methods the water-soluble lubricant is selected from polyethylene glycol having a weight average molecular weight of 600 to 9,000, monoether of polyoxyethylene, ester of polyoxyethylene, monoester of polyoxyethylene sorbitan and a polyoxyethylene-propylene block copolymer.

These methods show some improvement, while the effect on the prevention of heat generation in a drill is not satisfactory.

Further, JP-A-4-92494 discloses a water-soluble lubricant sheet formed from 20 to 90% by weight of a polyethylene glycol having a weight average molecular weight of at least 10,000 and 80 to 10% by weight of a water-soluble lubricant.

The above water-soluble lubricant sheet shows a sufficient improvement in the effect on the prevention of heat generation in a drill, while the defect with this sheet is that it is liable to break so that it is difficult to handle it.

SUMMARY OF THE INVENTION

It is an object of the present invention to provide a method of drilling a through-hole for a printed wiring board, in which the heat generation in a drill bit can be inhibited in drilling holes and quality holes can be highly efficiently made.

It is another object of the present invention to provide a method of drilling a through-hole for a printed wiring board, in which quality holes can be highly efficiently made in the presence of a novel water-soluble lubricant sheet which has high strength and can be handled easily.

According to the present invention, there is provided a method of drilling a through-hole for inter-surface conduction in a laminate produced by attaching a metal foil on an insulating material, with a water-soluble lubricant sheet on one surface or front and reverse sides of the laminate, wherein the water-soluble lubricant sheet is a 0.02 to 3 mm thick sheet formed from a mixture of 20 to 90% by weight of a polyether ester with 10 to 80 % by weight of a water-soluble lubricant.

DETAILED DESCRIPTION OF THE INVENTION

The laminate produced by attaching a metal foil to an insulating material, referred to in the present invention, is a material produced by integrating a metal foil and an insulating material and used for producing a printed wiring board. The above laminate includes a metal-clad laminate, a multilayered laminate having a printed wiring in an internal layer, a multilayered, metal-clad laminate having a printed wiring in an internal layer and a metal-clad plastic film.

The polyether ester used in the present invention is a water-soluble resin obtained by reacting a glycol or ethylene oxide such as polyethylene oxide, polypropylene glycol, polytetramethylene glycol, polypropylene oxide or a copolymer of at least two of these with phthalic acid, isophthalic acid, terephthalic acid, sebacic acid, dimethyl ester of any one of these, diethyl ester of any one of an these, a polyhydric alcohol such as trimellitic acid or anhydride or ester thereof. The melting point of the polyether ester is preferably in the range of from 30° to 200° C., particularly preferably in the range of from 35° to 150° C.

The water-soluble lubricant used in the present invention specifically includes polyethylene glycol having a weight average molecular weight of 500 to 9,000; monoethers of polyoxyethylenes such as polyoxyethylene oleyl ether, polyoxyethylene cetyl ether, polyoxyethylene stearyl ether, polyoxyethylene lauryl ether, polyoxyethylene dodecyl ether, polyoxyethylene nonylphenyl ether and polyoxyethylene octylphenyl ether; esters of polyoxyethylenes such as polyoxyethylene monolaurate, polyoxyethylene monostearate, polyoxyethylene monooleate and polyoxyethylene beef tallow fatty acid ester; monoesters of polyoxyethylene sorbitans such as polyoxyethylene sorbitan monostearate; polyglycerin monostearates such as hexaglycerin monostearate and decaglycerin monostearate; and a polyoxyethylene-propylene block copolymer. The melting point or softening point of the water-soluble lubricant is preferably in the range of from 30° to 200° C., particularly preferably in the range of from 40° to 150° C.

Generally, a sheet having a thickness of 0.02 to 3 mm is produced from a mixture of 20 to 90% by weight of the above polyether ester and 80 to 10% by weight of the above water-soluble lubricant, and this sheet is used as a water-soluble lubricant sheet. When the amount of the water-soluble lubricant is too large, undesirably, it is difficult to produce a sheet from the mixture. When it is too small, undesirably, the sheet shows insufficient lubricity.

The method for producing the above water-soluble lubricant sheet is not specially limited. For example, the water-soluble lubricant sheet is produced by a method in which the above polyether ester and the water-soluble lubricant are homogeneously mixed with a roll, a kneader or other kneading means under heat as required to prepare a homogeneous mixture and the mixture is extruded, press-processed or roll-processed to form a sheet having a thickness of 0.02 to 3 min. The sheet is placed on at least one plastic or metal foil surface of the laminate when used for drilling a hole in the laminate. When the water-soluble lubricant sheet used in the present invention is placed on one surface, it is preferred to place the sheet so that the sheet is on a drill bit side.

The water-soluble lubricant sheet is also preferably used by attaching it to an aluminum foil used as a material in drilling a hole, with an adhesive.

EXAMPLES

The present invention will be explained hereinafter with reference to Examples.

EXAMPLES 1-9

A polycondensate (trade name; PAOGEN PP-15 or Paogene EP-15, supplied by Dai-ichi Seiyaku Kogyo Co., Ltd.) from polyethylene glycol and dimethyl terephthalate was used as the polyether ester (to be referred to as PEES hereinafter). PEES and a water soluble lubricant in amounts shown in Table 1 were kneaded at a temperature of 80° to 1220° C. (in $N_2$ gas), and then the mixture was extruded with an extruder to form a sheet having a thickness o f 0.2 mm. Holes were drilled in 1.6 mm thick glass epoxy six-layered laminate (four inner layers, inner layer copper foil thickness 70 μm, outer layer copper foil thickness 18 μm) under the following conditions.

[Conditions for drilling holes]

| | |
|---|---|
| Drill bit | 0.35 mm in diameter |
| Revolution number | 80,000 rpm |
| Feed rate | 1.6 m/min |
| Number of laminates | 2 |

[Arrangement] (viewed from the drill bit side)

Water-soluble lubricant sheet
100 μm thick aluminum foil
Six-layered laminate
Six-layered laminate
Paper phenol laminate The above-obtained water-soluble lubricant sheet was evaluated for tensile strength, solubility in water and occurrence of smear, and further, the six-layered laminate were evaluated for a pink ring. Table 1 shows the results.

Comparative Example 1

Holes were made in the same manner as in Example 1 except that the arrangement changed as follows without using the water-soluble lubricant sheet. Table 1 shows the results.

(Drill bit side)
100 μm aluminum foil
Six-layered laminate
Six-layered laminate
Paper phenol laminate

Comparative Example 2

A sheet having a thickness of 0.2 mm was obtained from 40 parts by weight of a polyoxyethylene oxide having a weight average molecular weight of 160,000 (to be referred to as PO hereinafter) and 60 parts by weight of polyoxyethylene monostearate by kneading and extruding them in the same manner as in Example 1. The resultant sheet was evaluated in the same manner as in Example 1. Table 1 shows the results.

EXAMPLE 10

A sheet having a thickness of 0.2 mm was obtained from 20 parts by weight of a polyethylene glycol.dimethyl terephthalate condensate (trade name; PAOGEN PP-15, supplied by Dai-ichi Kogyo Yakuhin Co., Ltd.), 20 parts by weight of polyethylene oxide (trade name; ALCOX R-150, supplied by Meisei Chemical Co., Ltd.) and 60 parts by weight of polyoxyethylene monostearate by kneading and extruding them in the same manner as in Example 1. The resultant sheet was evaluated in the same manner as in Example 1. Table 1 shows the results.

The abbreviations used in Table 1 stand for the following.

*1: Water-soluble lubricants

LEG1=Polyethylene glycol having a weight average molecular weight of 1,000

LEG2=Polyoxyethylene lauryl ether having a weight average molecular weight of 1,100.

LEG3= Polyoxyethylene monostearate having a weight average molecular weight of 3,300

LEG4=Polyoxyethylene sorbitan monostearate having a weight average molecular weight of 1,300

LEG5=hexaglycerin monostearate having a weight average molecular weight of 530

LEG6=Polyoxyethylene-propylene block copolymer having a weight average molecular weight of 8,800

LEG7=Polyethylene glycol having a weight average molecular weight of 4,000

*2: Occurrence of smear after 4,000 bits

A wall of a through-hole was measured for an area in which the inner copper layer was exposed, i.e. a degree of adherence of a resin, by observing it with a microscope. The degree of occurrence of a smear was rated as follows: 100% exposure of copper=10, 50% exposure of copper=5, no exposure of copper=0. Specifically, 4,000 through-holes were drilled with a drill bit, and then 20 through-holes were drilled. The walls of these 20 through-holes were measured to obtain an average. In the column of "Occurrence of smear after 4,000 bits" in Table 1, the parenthesized data shows the smallest copper exposure area among the 20 through-holes.

*3: After drilled, two six-layered boards were immersed in a 4N HCl aqueous solution at 25° C. for 5 minutes, and a length of corrosion with 4N HCl from the through-hole wall was measured on each of the boards.

A smear and a pink ring prevent a contact between a plated through-hole and an electrically conductive layer formed on an insulating material, and the degrees of occurrence of these constitute an important standard for the evaluation of quality of printed wiring board.

*4: A sheet-shaped test piece having a width of 10 mm and a length of 100 mm was placed in water having a temperature of 40° C. so that the half of the test piece was perpendicularly immersed 50 mm deep in the water, and a time was counted until the test pieces was dissolved, broken and fallen in a portion contacting the water surface.

TABLE 1

| | Components for sheet | | | | | Tensile | After 4,000 bits | | Solubility in |
|---|---|---|---|---|---|---|---|---|---|
| | PEES | | | Water-soluble lubircant *1 | | strength | Occurrence | Pink | water *4 |
| | PP-15 | EP-15 | PO | kind | part | (kg/mm$^2$) | of smear *2 | ring *3 | (second) |
| Ex. 1 | 40 | — | — | LEG1 | 60 | 0.80 | 9.4(9.0) | 200 μm | 50 |
| Ex. 2 | 40 | — | — | LEG2 | 60 | 0.75 | 9.5(9.0) | 200 μm | 50 |
| Ex. 3 | 40 | — | — | LEG3 | 60 | 0.75 | 9.5(9.1) | 200 μm | 50 |

TABLE 1-continued

| | Components for sheet | | | | | Tensile | After 4,000 bits | | Solubility in |
|---|---|---|---|---|---|---|---|---|---|
| | PEES | | | Water-soluble lubircant *1 | | strength | Occurrence | Pink | water *4 |
| | PP-15 | EP-15 | PO | kind | part | (kg/mm²) | of smear *2 | ring *3 | (second) |
| Ex. 4 | 40 | — | — | LEG4 | 60 | 0.70 | 9.3(9.0) | 200 μm | 50 |
| Ex. 5 | 40 | — | — | LEG5 | 60 | 0.70 | 9.4(8.9) | 200 μm | 50 |
| Ex. 6 | 40 | — | — | LEG6 | 60 | 0.75 | 9.4(8.9) | 200 μm | 50 |
| Ex. 7 | 40 | — | — | LEG7 | 60 | 0.75 | 9.4(9.0) | 200 μm | 50 |
| Ex. 8 | — | 40 | — | LEG3 | 60 | 0.70 | 9.4(9.0) | 200 μm | 50 |
| Ex. 9 | 70 | — | — | LEG3 | 30 | 1.25 | 9.2(8.8) | 250 μm | 60 |
| Ex. 10 | 20 | — | 20 | LEG3 | 60 | 0.50 | 9.5(9.0) | 200 μm | 40 |
| CEx. 1 | — | — | — | — | — | — | 8.5(4.0) | 500 μm | — |
| CEx. 2 | — | — | 40 | LEG3 | 60 | 0.30 | 9.5(8.9) | 200 μm | 60 |

The water-soluble lubricant sheet, used in the present invention, has high strength and can be handled easily. The method using the above water-soluble lubricant sheet serves to drill a quality hole in a laminate with high efficiency, and therefore has high performance in practical use in industry.

What is claimed is:

1. A method of drilling a through-hole for inter-surface conduction in a laminate produced by attaching a metal foil on an insulating material, with a water-soluble lubricant sheet on one surface or front and reverse sides of the laminate, the method comprising drilling the through-holes in the presence of a water-soluble lubricant sheet which has a thickness of 0.02 to 3 mm and is formed from a mixture of 20 to 90% by weight of a polyether ester with 10 to 80% by weight of a water-soluble lubricant.

2. A method according to claim 1, wherein the water-soluble lubricant sheet is formed from at least one water-soluble lubricant selected from the group consisting of polyoxyethylene having a weight average molecular weight of 600 to 9,000, monoether of polyoxyethylene, ester of polyoxyethylene, monoester of polyoxyethylene sorbitan and a polyoxyethylene-propylene block copolymer and the polyether ester.

3. A method according to claim 1, wherein the water-soluble lubricant sheet is formed from a water-soluble polyether ester having a melting point or softening point of 30° to 200° C. and the water-soluble lubricant.

4. A method according to claim 1, wherein the water-soluble lubricant sheet is formed from a water-soluble lubricant having a melting point of softening point of 30° to 200° C. and the polyether ester.

* * * * *